(12) United States Patent
Bernacchia et al.

(10) Patent No.: US 10,388,782 B2
(45) Date of Patent: Aug. 20, 2019

(54) SCALABLE CURRENT SENSE TRANSISTOR

(71) Applicant: Infineon Technologies Austria AG, Villach (AT)

(72) Inventors: Giuseppe Bernacchia, Villach (AT); Riccardo Pittassi, Villach (AT); Oliver Blank, Villach (AT)

(73) Assignee: Infineon Technologies Austria AG, Villach (AT)

( * ) Notice: Subject to any disclaimer, the term of this patent is extended or adjusted under 35 U.S.C. 154(b) by 1124 days.

(21) Appl. No.: 14/572,845

(22) Filed: Dec. 17, 2014

(65) Prior Publication Data

US 2016/0178670 A1    Jun. 23, 2016

(51) Int. Cl.
| | |
|---|---|
| H01L 27/02 | (2006.01) |
| H01L 29/06 | (2006.01) |
| H01L 29/40 | (2006.01) |
| H01L 29/78 | (2006.01) |
| H01L 27/088 | (2006.01) |
| H01L 29/417 | (2006.01) |
| G01R 19/00 | (2006.01) |

(52) U.S. Cl.
CPC ...... *H01L 29/7813* (2013.01); *H01L 27/0207* (2013.01); *H01L 27/088* (2013.01); *H01L 29/0696* (2013.01); *H01L 29/41741* (2013.01); *H01L 29/7815* (2013.01); *G01R 19/0092* (2013.01); *H01L 29/407* (2013.01)

(58) Field of Classification Search
None
See application file for complete search history.

(56) References Cited

U.S. PATENT DOCUMENTS

| | | | |
|---|---|---|---|
| 2013/0127525 A1* | 5/2013 | Sung .................. | G05F 3/16 |
| | | | 327/538 |
| 2014/0264577 A1 | 9/2014 | Rieger et al. | |
| 2014/0284714 A1* | 9/2014 | Miyakoshi .......... | H01L 29/7824 |
| | | | 257/337 |
| 2015/0221566 A1* | 8/2015 | Ookura ............... | H01L 29/7397 |
| | | | 324/762.09 |

FOREIGN PATENT DOCUMENTS

CN    101821852 A    9/2010

* cited by examiner

*Primary Examiner* — Charles D Garber
*Assistant Examiner* — Xiaoming Liu
(74) *Attorney, Agent, or Firm* — Murphy, Bilak & Homiller, PLLC

(57) ABSTRACT

A semiconductor device includes a main transistor and a sense transistor. The main transistor is disposed in a semiconductor body and includes a plurality of sections which are individually controllable via separate gate electrodes disposed above the semiconductor body. The sense transistor is disposed in the same semiconductor body as the main transistor and has the same number of individually controllable sections as the main transistor. Each individually controllable section of the sense transistor is configured to mirror current flowing through one of the individually controllable sections of the main transistor and is connected to the same gate electrode as that individually controllable section of the main transistor. An electronic circuit that includes the semiconductor device and a current sense circuit that outputs a current sense signal representing the current mirrored by the sense transistor is also provided.

22 Claims, 7 Drawing Sheets

SCALABLE CURRENT SENSE TRANSISTOR

TECHNICAL FIELD

The present application relates to main transistor current sensing, in particular a scalable current sense transistor for mirroring current flowing through a main transistor.

BACKGROUND

Some conventional main transistors can scale output power on demand by selectively controlling different active regions of the transistor. For example, the main transistor can be subdivided into two or more sections of active regions. The gates of the main transistor cells included in a particular section are connected to the same gate electrode. As such, more than one gate electrode is provided for the main transistor and each of those gate electrodes corresponds to a different active region of the main transistor. Each section of the main transistor can be individually controlled via the corresponding gate electrode for that section. Such an arrangement effectively allows for programmable chip size on demand. As the load demand changes, so too does the effective size of the chip by individually controlling the different active regions of the main transistor.

One problem with the programmable chip size on demand approach explained above is that accurate sensing of the current flowing through the main transistor becomes more complex. A sense transistor typically is coupled in parallel with the main transistor and controlled by a single gate signal in order to mirror the current flowing through the main transistor. A current sense circuit such as an operational amplifier equalizes the voltage at a common sense node of the sense and main transistors (e.g. the source in the case of an nMOS transistors and the drain in the case of pMOS transistors), and outputs a current estimate corresponding to the current mirrored by the sense transistor. However, the on-state resistance (Ron) of the main transistor varies significantly depending on which active regions of the main transistor are on and which ones are off. As a result, the Ron of the main transistor varies as the load demand changes.

To implement a conventional sense transistor in a main transistor die having the programmable chip size on demand approach explained above requires a scaling of the current sense output of the current sense circuit as a function of which active regions of the main transistor are on and which ones are off. In other words, the ratio of the on-resistance of the sense transistor to that of the main transistor depends on which gates of the main transistor are active and which ones are not active. A conventional solution is to adjust the gain of the current sense circuit based on the operating mode of the main transistor. However, this approach requires on-the-fly scaling of the current sense output which increases the complexity and cost of the system.

SUMMARY

According to an embodiment of a semiconductor device, the semiconductor device comprises a main transistor and a sense transistor. The main transistor is disposed in a semiconductor body and comprises a plurality of sections which are individually controllable via separate gate electrodes disposed above the semiconductor body. The sense transistor is disposed in the same semiconductor body as the main transistor and comprises the same number of individually controllable sections as the main transistor. Each individually controllable section of the sense transistor is configured to mirror current flowing through one of the individually controllable sections of the main transistor and is connected to the same gate electrode as that individually controllable section of the main transistor.

According to an embodiment of a semiconductor device, the semiconductor device comprises a main transistor and a sense transistor. The main transistor is disposed in a semiconductor body and comprises a plurality of sections which are individually controllable via separate gate electrodes disposed above the semiconductor body. The sense transistor is disposed in the same semiconductor body as the main transistor and comprises the same number of individually controllable sections as the main transistor. The sense transistor is configured to mirror total current flowing through the main transistor in the same proportion regardless of the number of individually controllable sections of the main transistor which are activated via the respective gate electrodes.

According to an embodiment of an electronic circuit, the electronic circuit comprises a main transistor, a sense transistor and a current sense circuit. The main transistor is disposed in a semiconductor body and comprises a plurality of sections which are individually controllable via separate gate electrodes disposed above the semiconductor body. The sense transistor is disposed in the same semiconductor body as the main transistor and comprises the same number of individually controllable sections as the main transistor. The sense transistor is configured to mirror total current flowing through the main transistor in the same proportion regardless of the number of individually controllable sections of the main transistor which are activated via the respective gate electrodes. The current sense circuit is configured to sense the total current flowing through the main transistor and the current mirrored by the sense transistor at a common node of the main and the sense transistors. The current sense circuit is further configured to equalize the voltage at the common node of the main and the sense transistors and output a current sense signal representing the current mirrored by the sense transistor.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Embodiments described herein provide a sense transistor disposed in the same semiconductor body as a main transistor and having the same number of individually controllable sections as the main transistor. The main transistor can be any type of transistor such as, but not limited to, a power transistor, an RF transistor, a small signal transistor, an SMPS (switched-mode power supply) transistor, etc. The sense transistor is configured to mirror the total current flowing through the main transistor in the same proportion regardless of the number of individually controllable sections of the main transistor which are activated via respective gate electrodes. This way, the ratio (Ron_sense/Ron_main) of the on-resistance (Ron_sense) of the sense transistor to the on resistance (Ron_main) of the main transistor remains relatively constant even as the effective active area of the main transistor changes in response to load demand. Moreover, the gain of the current sense circuit coupled to the sense transistor need not necessarily be adjusted as a function of the operating mode of the main transistor to maintain relatively constant Ron_sense/Ron_main. Instead, the number of active regions of the sense transistor is adjusted proportionally and in conjunction with the number of active regions of the main transistor. Effectively the chip size of both the main transistor and the sense transistor are adjustable on demand to maintain relatively constant Ron_sense/Ron_main, even as the number of active regions of the main transistor changes in response to load demand.

Figure 1:
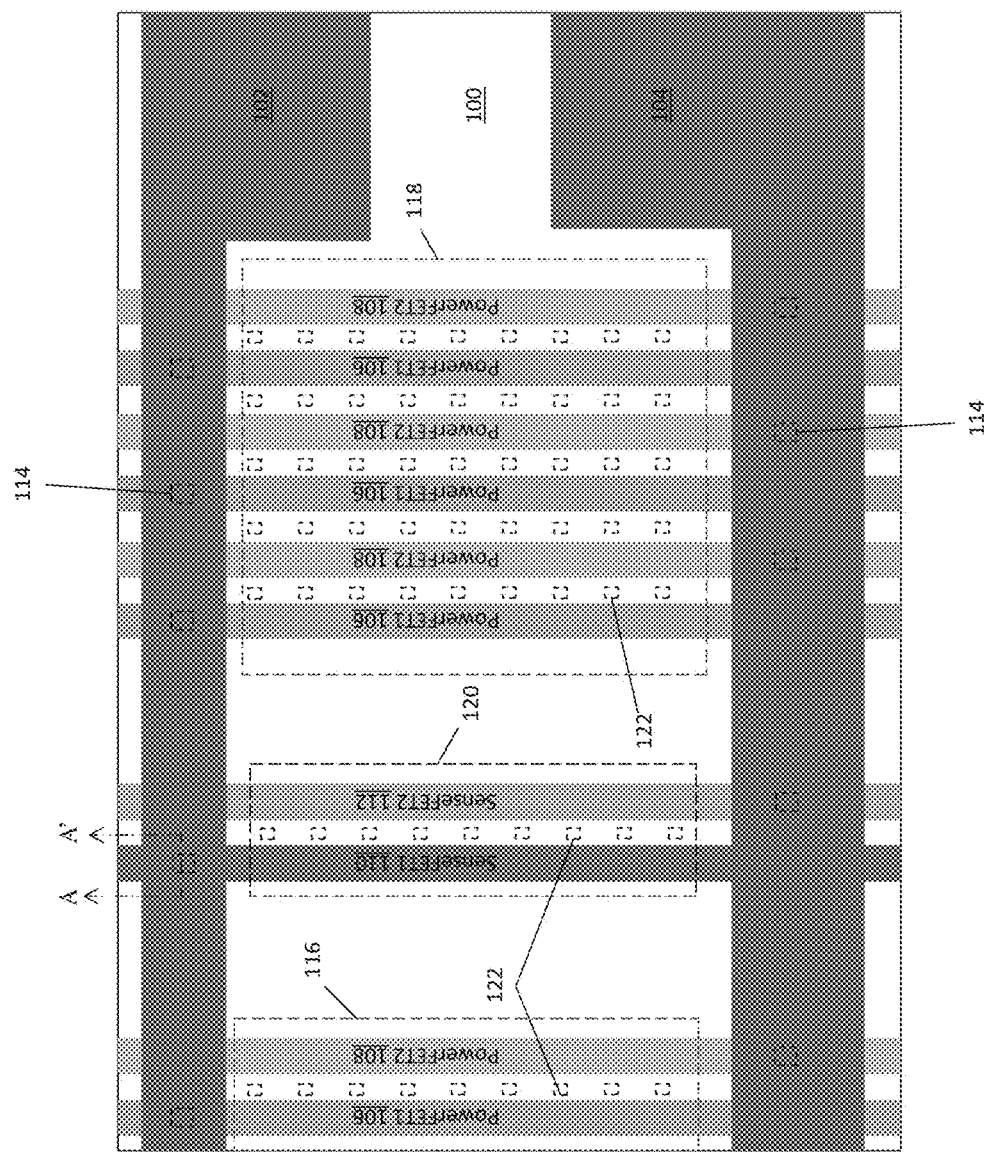
FIG. 1 illustrates a top-down plan view of part of a semiconductor device that includes a sense transistor disposed in the same semiconductor body as a main transistor.

FIG. 1 illustrates a top-down plan view of part of a semiconductor device that includes a sense transistor disposed in the same semiconductor body as a main transistor. The construction of the transistors are explained next in the context of silicon technology, however any semiconductor technology that allows for the segmentation of a transistor into individually controllable sections can be used. For example in the case of a III-nitride technology such as GaN, the transistor channel is formed by a two-dimensional hole or electron gas as opposed to silicon technology which requires a sufficient gate bias for attracting electrons or holes to form (or disrupt) a bidirectional channel between the drain and source. Still other semiconductor technologies such as GaAs, SiC, etc. can be used. In each case, the main and sense transistors of the semiconductor device can each be segmented into sections which are individually controllable via separate gate electrodes.

In general, the main transistor is disposed in a semiconductor body 100 and comprises a plurality of sections which are individually controllable via separate gate electrodes 102, 104 disposed above the semiconductor body 100. Dielectric layer(s) which insulate the gate electrodes 102, 104 from the underlying semiconductor body 100 are not shown in the top-down plan view of FIG. 1 for ease of illustration, but are visible in the corresponding sectional view of FIG. 2. Two individually controllable sections of the main transistor are shown in FIG. 1. The first section includes the main transistor gates 106 labeled 'PowerFET1' in FIG. 1, and the second section includes the main transistor gates 108 labeled 'PowerFET2'. In general, the main transistor can comprise two or more sections which are individually controllable via separate gate electrodes 102, 104.

The amount of current output by the main transistor is adjusted by changing the number of main transistor sections which are activated via the corresponding gate electrodes 102, 104. For example, the first section of the main transistor can be activated via the gate electrode 102 connected to the gates 106 disposed in the first section i.e. the section that includes the gates 106 labeled 'PowerFET1' in FIG. 1. The output current can be increased by activating the second section of the main transistor via the gate electrode 104 connected to the gates 108 disposed in the second section i.e. the section that includes the gates 108 labeled 'PowerFET2' in FIG. 1 and so on. The number of main transistor sections which are activated at any instance depends on load demand.

The sense transistor mirrors the current flowing through the main transistor and is disposed in the same semiconductor body 100 as the main transistor. The sense transistor comprises the same number of individually controllable sections as the main transistor. As explained previously herein, two individually controllable sections of the main transistor are shown in FIG. 1 for ease of illustration and therefore two corresponding individually controllable sections of the sense transistor are also shown. The first individually controllable section of the sense transistor includes the sense transistor gate 110 labeled 'SenseFET1' in FIG. 1, and the second individually controllable section of the sense transistor includes the sense transistor gate 112 labeled 'SenseFET2'. In one embodiment, the gates 110, 112 of the sense transistor are disposed closer to the center region of the main transistor where the main transistor tends to generate more heat than to the edge region of the main transistor.

Each individually controllable section of the sense transistor is configured to mirror current flowing through one of the individually controllable sections of the main transistor and is connected to the same gate electrode 102/104 as that section of the main transistor. In FIG. 1, the first individually controllable section of the sense transistor i.e. the sense transistor section that includes the gate 110 labeled 'SenseFET1' in FIG. 1 is connected to the same gate electrode 102 as the first individually controllable section of the main transistor i.e. the main transistor section that includes the gates 106 labeled 'PowerFET1' in FIG. 1 and mirrors current flowing through the first section of the main transistor. Similarly, the second individually controllable section of the sense transistor i.e. the sense transistor section that includes the gate 112 labeled 'SenseFET2' in FIG. 1 is connected to the same gate electrode 104 as the second individually controllable section of the main transistor i.e. the main transistor section that includes the gates 108 labeled 'PowerFET2' in FIG. 1 and mirrors current flowing through the second section of the main transistor.

With such a configuration, the first individually controllable section of the sense transistor is activated (on) when the first individually controllable section of the main transistor is activated, the second individually controllable section of the sense transistor is activated when the second individually controllable section of the main transistor is activated, etc. Connections from the gate electrodes 102, 104 to the corresponding gates 106, 108, 110, 112 of the transistors are provided by conductive contacts 114 such as conductive vias which are illustrated as dashed boxes in FIG. 1 because the contacts 114 extend through the dielectric layer(s) interposed between the gate electrodes 102, 104 and the underlying semiconductor body 100 and are therefore out of view in FIG. 1.

Figure 2:
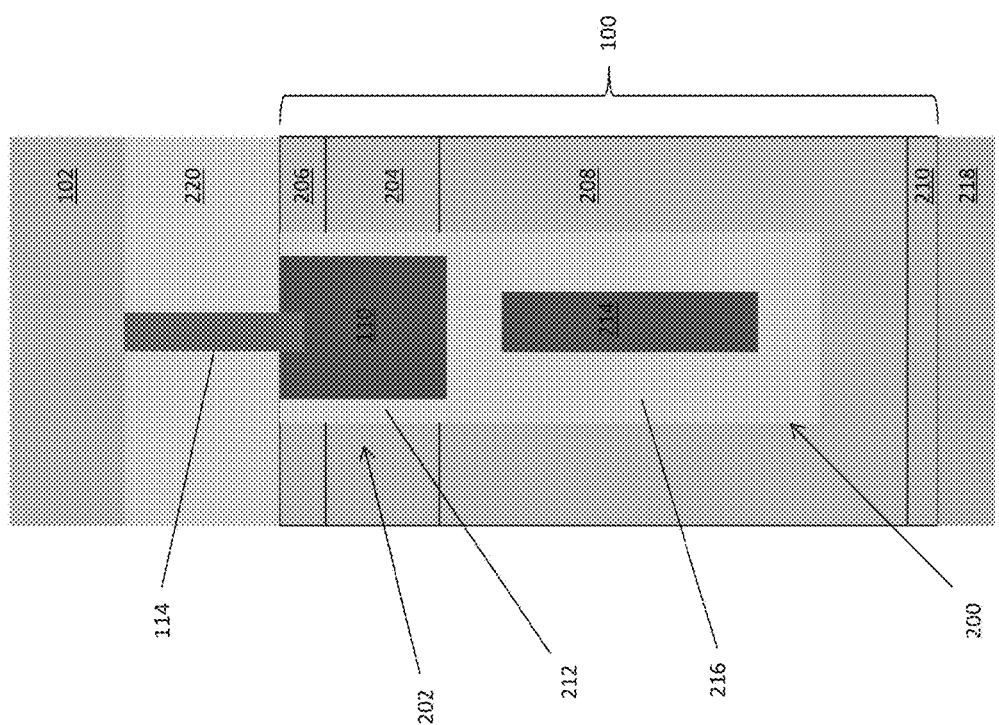
FIG. 2 illustrates a sectional view of one cell of the sense transistor along the line labelled A-A' in FIG. 1.

FIG. 2 illustrates a sectional view of one cell of the sense transistor along the line labelled A-A' in FIG. 1. The sense transistor cell is illustrated in silicon technology in FIG. 2 as a non-limiting example, but could be implemented in any semiconductor technology that allows for the segmentation of a transistor into individually controllable sections e.g. such as GaN or other III-nitride technology, GaAs, SiC, etc. The cells of the main transistor can have the same or similar construction as the sense transistor cell.

The sense transistor cell includes a gate 110 disposed in a trench 200 formed in the semiconductor body 100. The gate 110 controls a channel region 202 of the transistor cell disposed adjacent the gate 110. For example in the case of silicon technology and a vertical transistor cell, the cell can also include a body region 204, a source region 206 disposed in the body region 204, a drift region 208 adjacent and below the body region 204, and a drain region 210 below the drift region 208. The source, drift and drain regions 206, 208, 210 are of the same conductivity type (e.g. n-type in the case of an nMOS cell and p-type in the case of a pMOS cell). The body region 204 is of the opposite conductivity type (e.g. p-type in the case of an nMOS cell and n-type in the case of a pMOS cell). The channel region 202 is located in the body region 204 and extends along the gate 110 which is insulated from the surrounding semiconductor material by a gate dielectric 212. In a GaN cell, the channel region 202 would be a two-dimensional hole or electron gas. In each case, the gate 110 controls the conducting state of the channel region 202. A field electrode 214 insulated from the surrounding semiconductor material by a field dielectric 216 can be disposed in the lower part of the trench 200 below the gate 110, provided in a separate trench from the gate 110, or omitted.

The drain region 210 is contacted by a drain electrode 218 disposed on the bottom side of the semiconductor body 100. The gate 110 is electrically contacted by a gate electrode 102 and a contact 114 that extends from the gate electrode 102 to the gate 110 through one or more dielectric layers 220 that separate the gate electrode 102 from the semiconductor body 100. In the case of silicon technology, the dielectric layer(s) 220 can comprise silicon oxide. In the case of GaN technology, the dielectric layer(s) 220 can comprise silicon nitride. Still other types of standard dielectric materials can be used.

In each case, the first individually controllable section of the main transistor includes a first group of the main transistor cells i.e. the main transistor section that includes the cells with the gates 106 labeled 'PowerFET1' in FIG. 1 and the second individually controllable section of the main transistor includes a second group of the main transistor cells i.e. the main transistor section that includes the cells with the gates 108 labeled 'PowerFET2' in FIG. 1. The gates 106 included in the first group of main transistor cells are connected to a first one of the gate electrodes 102, the gates 108 included in the second group of main transistor cells are connected to a second one of the gate electrodes 104, etc.

In a similar manner, the first individually controllable section of the sense transistor includes a first one of the sense transistor cells i.e. the sense transistor section that includes the cell with the gate 110 labeled 'SenseFET1' in FIG. 1 and the second individually controllable section of the sense transistor includes a second one of the sense transistor cells i.e. the sense transistor section that includes the cell with the gate 112 labeled 'SenseFET2' in FIG. 1. The gate 110 of the first sense transistor cell is connected to the first gate electrode 102, the gate 112 of the second sense transistor cell is connected to the second gate electrode 104, etc. In this way, the sense transistor is segmented or divided into the same number of individually controllable sections as the main transistor. As such, the ratio Ron_sense/Ron_main of the on-resistance Ron_sense of the sense transistor to the on resistance Ron_main of the main transistor remains relatively constant even as the effective active area of the main transistor changes in response to load demand. In other words, the ratio of the total active area (Apactive1) for the first group of main transistor cells to the total active area (Apactive2) for the second group of main transistor cells equals the ratio of the active area (Asactive1) of the first sense transistor cell to the active area (Asactive2) of the second sense transistor cell as given by:

$$Ap\text{active1}/Ap\text{active2} = As\text{active1}/As\text{active2} \quad (1)$$

where the active area of a transistor cell is the part of the cell through which output current flows.

Equation (1) holds true because the first section of the sense transistor is controlled by the same gate electrode 102 as the first section of the main transistor and the second section of the sense transistor is controlled by the same gate electrode 104 as the second section of the main transistor. This approach can be extended to any number of main and sense transistor sections, and depends on the particular design of the semiconductor device. For example, the main and sense transistors can be subdivided into three or more individually controllable sections where each section of the sense transistor is individually controlled by the same gate electrode that controls the corresponding section of the main transistor. Also, each individually controllable section of the sense transistor can include more than one cell and therefore more than one gate 110/112. In general with this approach, the sense transistor mirrors the total current flowing through the main transistor in the same proportion regardless of the number of individually controllable sections of the main transistor which are activated via the respective gate electrodes 102, 104.

According to the embodiment illustrated in FIG. 1, the main transistor gates 106 of the first group are interleaved with the main transistor gates 108 of the second group and each sense transistor gate 110/112 is interposed between two of the main transistor gates 106/108. Each of the main transistor gates 106, 108 forms part of a cell of the main transistor and each of the sense transistor gates 110, 112 forms part of a cell of the sense transistor as previously described herein in connection with FIG. 2. Source electrodes 116, 118, 120 disposed above the semiconductor body 100 are connected to the sources of the transistor cells. The source electrodes 116, 118 connected to the sources of the main transistor cells are separate from the source electrode 120 connected to the sources of the sense transistor cells.

Connections from the respective source electrodes 116, 118, 120 to the corresponding sources of the main and sense transistors are provided by conductive contacts 122 such as conductive vias which are illustrated as dashed boxes in FIG. 1 because the contacts extend through the dielectric layer(s) interposed between the source electrodes 116, 118, 120 and the underlying semiconductor body 100 and are therefore out of view in FIG. 1. The source electrodes 116, 118, 120 are also shown as dashed boxes in FIG. 1 even though they are disposed above the semiconductor body 100, so as to not interfere with the view of the underlying transistor gates 106, 108, 110, 112.

Figure 3:
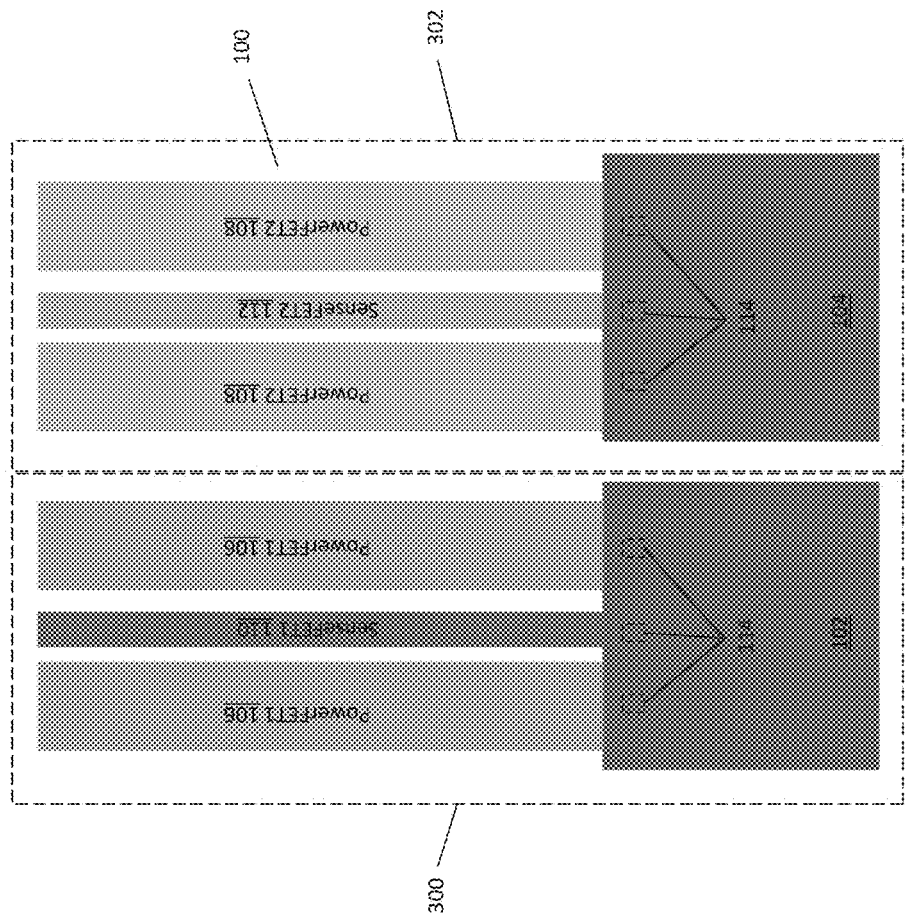
FIG. 3 illustrates a top-down plan view of part of a semiconductor device that includes a sense transistor disposed in the same semiconductor body as a main transistor, according to another embodiment.

FIG. 3 illustrates a top-down plan view of part of a semiconductor device that includes a sense transistor disposed in the same semiconductor body as a main transistor. The embodiment shown in FIG. 3 is similar to the embodiment shown in FIG. 1, however, the gates 106, 108 of the different individually controllable sections of the main transistor are not interleaved. Instead, the main transistor is divided into two parts 300, 302 in FIG. 3 which are laterally spaced apart from one another in the semiconductor body 100. The main transistor gates 106 in the first part 300 of the semiconductor body 100 are connected to one gate electrode 102 and the main transistor gates 108 in the second part 302 of the semiconductor body 100 are connected to a different gate electrode 104. The first sense transistor gate 110 is disposed in the first part 300 of the semiconductor body 100 and the second sense transistor gate 112 is disposed in the second part 302 of the semiconductor body 100. In one embodiment, the first sense transistor gate 110 is interposed between two of the main transistor gates 106 in the first part 300 of the semiconductor body 100 and the second sense transistor gate 112 is interposed between two of the main transistor gates 108 in the second part 302 of the semiconductor body 100.

The main and sense transistor gates 106, 110 included in the first part 300 of the semiconductor body 100 are connected to the same first gate electrode 102 and therefore are activated and deactivated together. Similarly, the main and sense transistor gates 108, 112 included in the second part 302 of the semiconductor body 100 are connected to the same second gate electrode 104 and therefore are activated and deactivated together. With this approach, the ratio of the total active area (Apactive1) of the main transistor cells disposed in the first part 300 of the semiconductor body 100 to the total active area (Apactive2) of the main transistor cells disposed in the second part 302 of the semiconductor body 100 equals the ratio of the active area (Asactive1) of the first sense transistor cell to the active area (Asactive2) of the second sense transistor cell as given by equation (1) regardless of which sections of the main transistor are activated. The main and sense transistors can be divided into more than two corresponding sections, by dividing the semiconductor body 100 into a corresponding number of parts which are laterally spaced apart from one another in the semiconductor body 100. Also, each individually controllable section of the sense transistor can include more than one sense transistor cell and therefore more than one gate 110/112.

Figure 4:
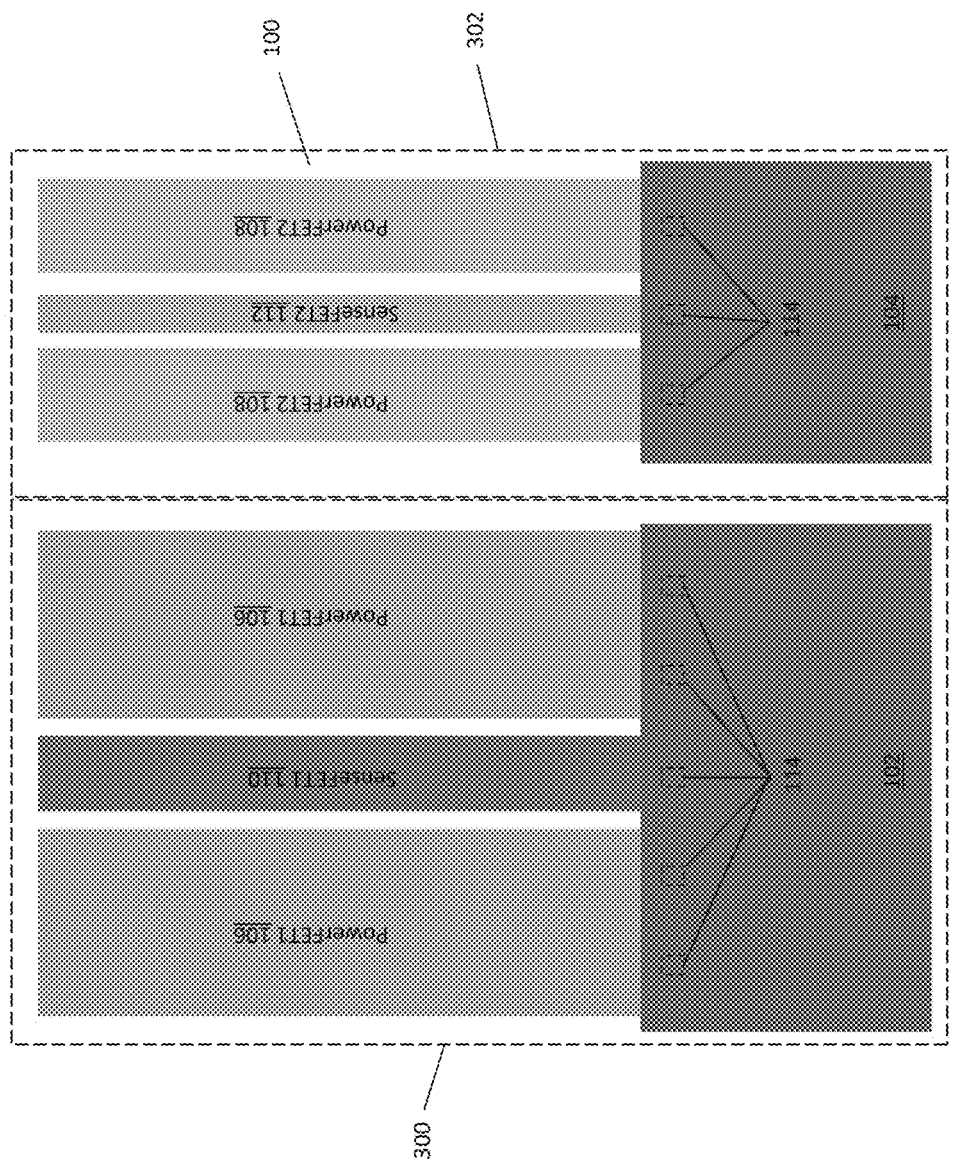
FIG. 4 illustrates a top-down plan view of part of a semiconductor device that includes a sense transistor disposed in the same semiconductor body as a main transistor, according to yet another embodiment.

FIG. 4 illustrates a top-down plan view of part of a semiconductor device that includes a sense transistor disposed in the same semiconductor body 100 as a main transistor. The embodiment shown in FIG. 4 is similar to the embodiment shown in FIG. 3, however, the first part 300 of the semiconductor body 100 is larger than the second part 302 of the semiconductor body 100. For example, the first part 300 of the semiconductor body 100 can be 1.5×, 2×, 2.5×, 3×, etc. larger or smaller than the second part 302 of the semiconductor body 100. As a result, the combined active area of the main transistor cells included in the first part 300 of the semiconductor body 100 is different (larger in this case) than the combined active area of the main transistor cells included in the second part 302 of the semiconductor body 100.

The active area of the first sense transistor cell is scaled in relation to the active area of the second sense transistor cell based on the difference between the combined active areas of the main transistor cells included in the first and second parts 300, 302 of the semiconductor body 100. In the illustrated example, the active area of the first sense transistor cell i.e. the sense transistor cell having the gate 110 labeled 'SenseFET1' in FIG. 4 is larger than the active area of the second sense transistor cell i.e. the sense transistor cell having the gate 112 labeled 'SenseFET2' in FIG. 4. The opposite applies if the first part 300 of the semiconductor body 100 were smaller than the second part 302 of the semiconductor body 100. In either case, the active area of the individually controllable sections of the sense transistor are scaled in proportion to the size differences between the different parts 300, 302 of the semiconductor body 100 so that equation (1) is satisfied regardless of which sections of the main transistor are activated. As a result, the gain of the current sense circuit (not shown in FIG. 4) coupled to the sense transistor need not necessarily be adjusted as a function of the operating mode of the main transistor to maintain relatively constant Ron_sense/Ron_main. Instead, the number of active regions of the sense transistor is adjusted proportionally and in conjunction with the number of active regions of the main transistor.

Figure 5:
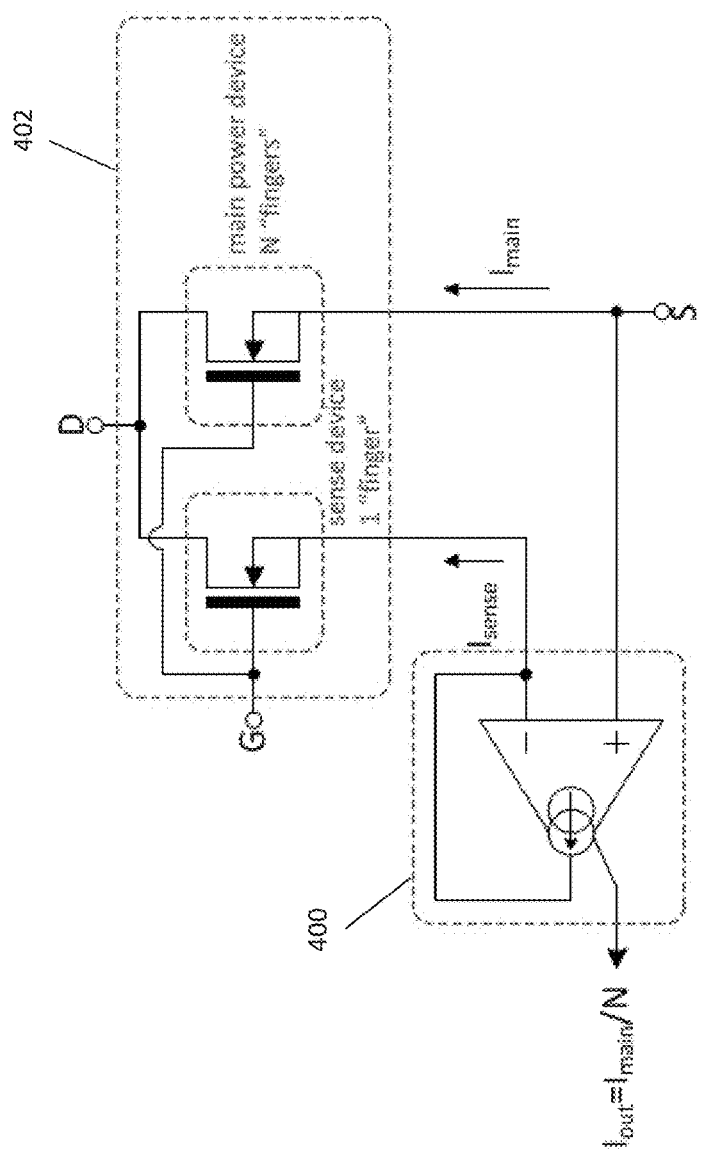
FIGS. 5 through 7 illustrate different embodiments of a current sense circuit coupled to a sense transistor disposed in the same semiconductor body as a main transistor.

FIG. 5 illustrates a circuit schematic of a current sense circuit 400 coupled to the sense transistor. The current sense circuit 400 can be integrated in the same die (chip) 402 as the sense and main transistors, or provided in a separate die. In either case, the current sense circuit 400 senses the total current (Imain) flowing through the main transistor and the current mirrored (Isense) by the sense transistor at a common node of the main and sense transistors. The current sense circuit 400 also equalizes the voltage at the common node of the main and the sense transistors and outputs a current sense signal (Iout) which represents the current mirrored by the sense transistor. In the example shown in FIG. 4, the main transistor has N cells or fingers and the sense transistor has a single cell (finger). As such, Iout=Imain/N in this example.

The current sense circuit 400 is an operational transconductance amplifier (OTA) according to this embodiment. The OTA ensures that that the source of the sense transistor and the source of the main transistor are at the same potential i.e. virtual ground of the OTA. The current flowing through the sense transistor is 1/N the current flowing through the main transistor. A copy of the OTA output current is used as a representation of the output of the current sense circuit. 400

Figure 6:
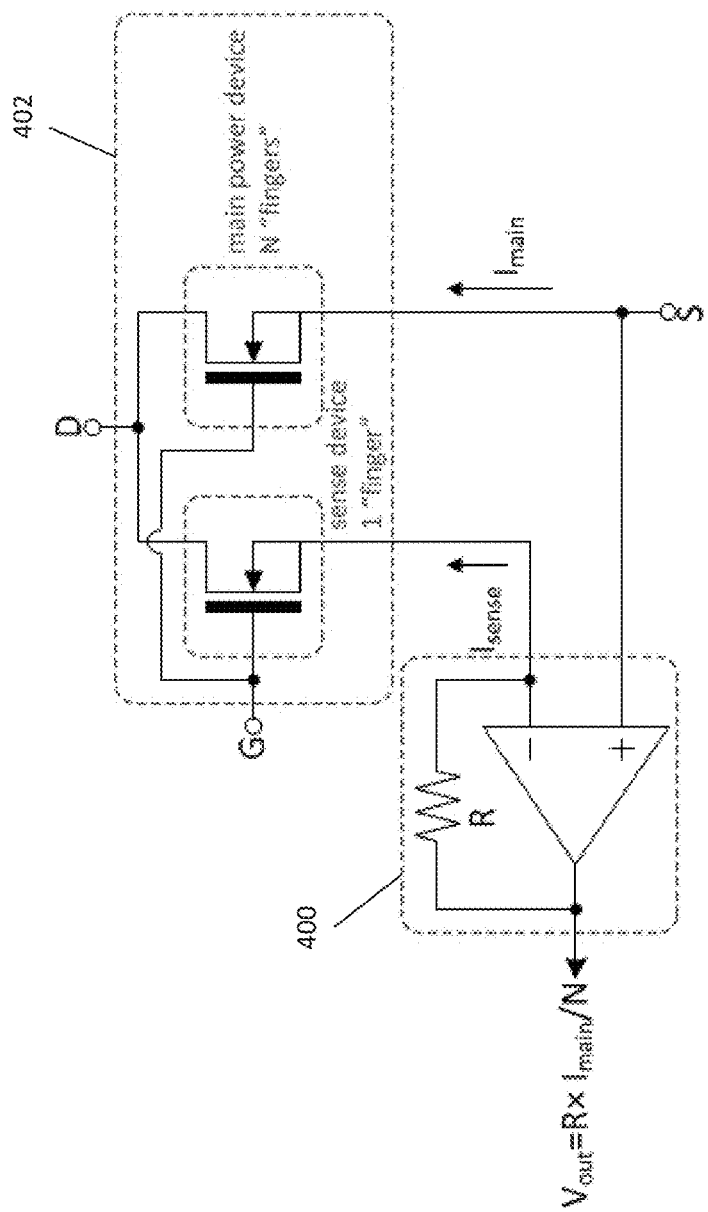

FIG. 6 illustrates another circuit schematic of the current sense circuit 400 coupled to the sense transistor. The embodiment shown in FIG. 6 is similar to the embodiment shown in FIG. 5, however, the OTA is replaced by an operational amplifier with a resistor (R) in the feedback path. The net effect is the same: current Isense=Imain/N also flows through the sense resistor R in order to equalize the source potentials of the sense and main transistors at virtual ground of the operational amplifier. When the source potential of the sense and main transistors is 0V, the current sense output is a voltage (Vout) given by:

$$Vout = Isense*R = R*Imain/N \qquad (2)$$

In other embodiments, the current sense circuit 400 is implemented digitally. The virtual ground can be obtained by closing the loop digitally. A comparator can detect whether the source voltages of the sense and main transistors are different and drives a digital integrator (e.g. up/down counter) accordingly. The integrator in turn drives a current steering DAC (digital-to-analog converter), which injects the current into the sense transistor similar to the OTA operation previously described herein. The current sense output signal is digital in this embodiment.

Figure 7:
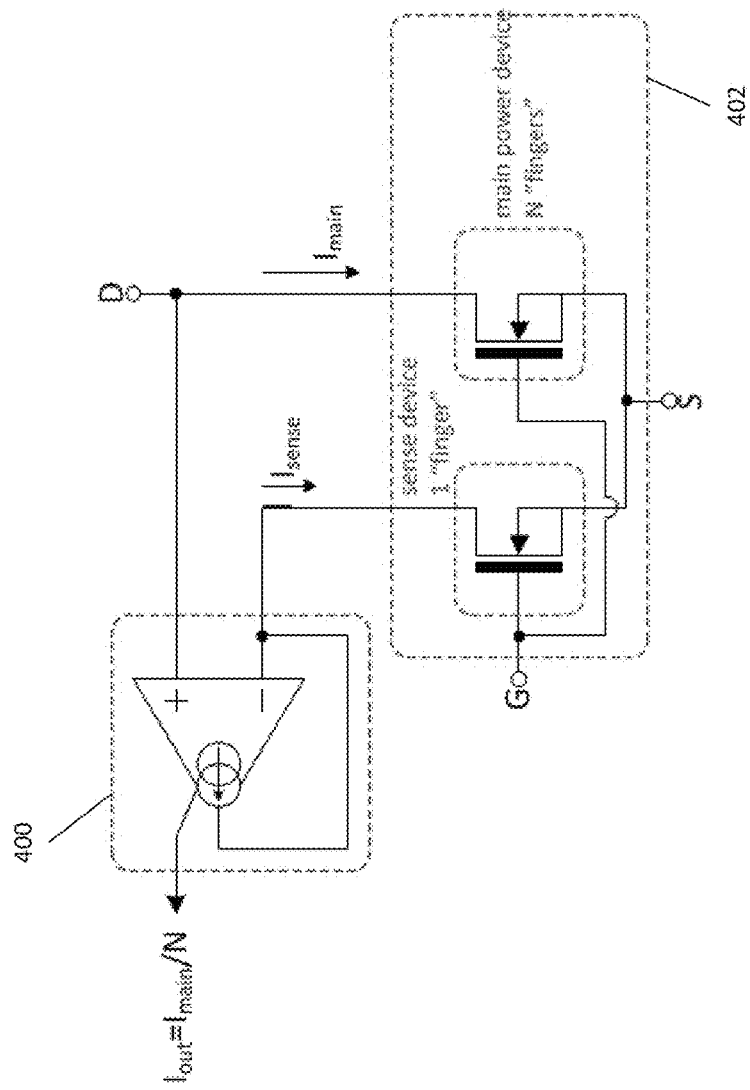

FIG. 7 illustrates yet another circuit schematic of the current sense circuit 400 coupled to the sense transistor. The circuit configuration shown in FIG. 7 is similar to the configuration shown in FIG. 5, however, the sense and main transistors have a common source instead of a common drain so that the drain potential has to be equalized instead of the source potential. The current sense output Iout of the current sense circuit 400 in FIG. 7 is given by equation (2). Still other types of current sense circuits can be utilized. In each case, the gain of the current sense circuit 400 remains fixed regardless of the number of individually controllable sections of the main transistor which are activated during operation in response to load demand. Also, the sense and main transistors are shown as nMOS devices in FIGS. 5-7. However, the sense and main transistors can instead be pMOS devices. The embodiments described herein apply equally to both nMOS and pMOS devices.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor device, comprising:
a main transistor disposed in a semiconductor body and comprising a plurality of sections which are individually controllable via separate gate electrodes disposed above the semiconductor body; and
a sense transistor disposed in the same semiconductor body as the main transistor and comprising the same number of individually controllable sections as the main transistor, each individually controllable section of the sense transistor being configured to mirror current flowing through one of the individually controllable sections of the main transistor and being connected to the same gate electrode as that individually controllable section of the main transistor.

2. The semiconductor device of claim 1, wherein:
the main transistor comprises a plurality of main transistor gates disposed in trenches formed in thy: semiconductor body, each main transistor gate being configured to control a channel region of the main transistor disposed adjacent that main transistor gate;
a first one of the individually controllable sections of the main transistor includes a first group of the main transistor gates;
a second one of the individually controllable sections of the main transistor includes a second group of the main transistor gates;
the first group of main transistor gates is connected to a first one of the gate electrodes;
the second group of main transistor gates is connected to a second one of the gate electrodes;
the sense transistor comprises a plurality of sense transistor gates disposed in trenches formed in the semiconductor body, each sense transistor gate being configured to control a channel region of the sense transistor disposed adjacent that sense transistor gate;
a first one of the individually controllable sections of the sense transistor includes a first one of the sense transistor gates;
a second one of the individually controllable sections of the sense transistor includes a second one of the sense transistor gates;
the first sense transistor gate is connected to the first gate electrode; and
the second sense transistor gate is connected to the second gate electrode.

3. The semiconductor device of claim 2, wherein:
the main transistor gates of the first group are interleaved with the main transistor gates of the second group; and
the sense transistor gates are interposed between two of the main transistor gates.

4. The semiconductor device of claim 3, wherein each of the main transistor gates forms part of a cell of the main transistor and each of the sense transistor gates forms part of a cell of the sense transistor, the semiconductor device further comprising:
a first source electrode disposed above the semiconductor body and connected to a source of the main transistor cells of the first group;
a second source electrode disposed above the semiconductor body and connected to a source of the main transistor cells of the second group; and
a third source electrode disposed above the semiconductor body and connected to a source of the sense transistor cells.

5. The semiconductor device of claim 2, wherein:
the main transistor gates of the first group are disposed in a first part of the semiconductor body;
the main transistor gates of the second group are disposed in a second part of the semiconductor body laterally spaced apart from the first part;
the first sense transistor gate is disposed in the first part of the semiconductor body; and
the second sense transistor gate is disposed in the second part of the semiconductor body.

6. The semiconductor device of claim 5, wherein:
the first sense transistor gate is interposed between two of the main transistor gates of the first group in the first part of the semiconductor body; and
the second sense transistor gate is interposed between two of the main transistor gates of the second group in the second part of the semiconductor body.

7. The semiconductor device of claim 5, wherein:
each of the main transistor gates forms part of a cell of the main transistor;
the first sense transistor gate forms part of a first cell of the sense transistor;
the second sense transistor gate forms part of a second cell of the sense transistor;
a combined active area of the main transistor cells included in the first part of the semiconductor body is different than the combined active area of the main transistor cells included in the second part of the semiconductor body; and
an active area of the first sense transistor cell is scaled in relation to the active area of the second sense transistor cell based on the difference between the combined active areas of the main transistor cells included in the first and second parts of the semiconductor body.

8. The semiconductor device of claim 1, wherein each individually controllable section of the main transistor comprises a plurality of gates disposed in trenches formed in the semiconductor body and connected to the same one of the gate electrodes, and wherein each individually controllable section of the sense transistor comprises a gate disposed in a trench formed in the semiconductor body and connected to the same gate electrode as the individually controllable section of the main transistor mirrored by that individually controllable section of the sense transistor.

9. The semiconductor device of claim 8, wherein the gates of the sense transistor are disposed closer to a center region of the main transistor than to an edge region of the main transistor.

10. The semiconductor device of claim 1, wherein the main transistor is a metal-oxide semiconductor field-effect transistor (MOSFET), the sense transistor is a MOSFET, and the semiconductor device includes a main source terminal for the main transistor and a sense source terminal for the sense transistor, wherein the main source terminal and the sense source terminal provide separate electrical connections to the semiconductor device.

11. The semiconductor device of claim 1, wherein the main transistor is a metal-oxide semiconductor field-effect transistor (MOSFET), the sense transistor is a MOSFET, and the semiconductor device includes a main drain terminal for the main transistor and a sense drain terminal for the sense transistor, wherein the main drain terminal and the sense drain terminal provide separate electrical connections to the semiconductor device.

12. A semiconductor device, comprising:
a main transistor disposed in a semiconductor body and comprising a plurality of sections which are individually controllable via separate gate electrodes disposed above the semiconductor body; and
a sense transistor disposed in the same semiconductor body as the main transistor and comprising the same number of individually controllable sections as the main transistor, the sense transistor being configured to mirror total current flowing through the main transistor in the same proportion regardless of the number of individually controllable sections of the main transistor which are activated via the respective gate electrodes.

13. An electronic circuit, comprising:
a main transistor disposed in a semiconductor body and comprising a plurality of sections which are individually controllable via separate gate electrodes disposed above the semiconductor body;
a sense transistor disposed in the same semiconductor body as the main transistor and comprising the same number of individually controllable sections as the main transistor, the sense transistor being configured to mirror total current flowing through the main transistor the same proportion regardless of the number of individually controllable sections of the main transistor which are activated via the respective gate electrodes; and
a current sense circuit configured to:
sense the total current flowing through the main transistor and the current mirrored by the sense transistor at a common node of the main and the sense transistors;
equalize the voltage at the common node of the main and the sense transistors; and
output a current sense signal representing the current mirrored by the sense transistor.

14. The electronic circuit of claim 13, wherein a gain of the current sense circuit remains fixed regardless of the number of individually controllable sections of the main transistor which are activated via the respective gate electrodes.

15. The electronic circuit of claim 13 wherein:
the main transistor comprises a plurality of main transistor gates disposed in trenches formed in the semiconductor body, each main transistor gate being configured to control a channel region of the main transistor disposed adjacent that main transistor gate;
a first one of the individually controllable sections of the main transistor includes a first group of the main transistor gates;
a second one of the individually controllable sections of the main transistor includes a second group of the main transistor gates;
the first group of main transistor gates is connected to a first one of the gate electrodes;
the second group of main transistor gates is connected to a second one of the gate electrodes;
the sense transistor comprises a plurality of sense transistor gates disposed in trenches formed in the semiconductor body, each sense transistor gate being configured to control a channel region of the sense transistor disposed adjacent that sense transistor gate;
a first one of the individually controllable sections of the sense transistor includes a first one of the sense transistor gates;
a second one of the individually controllable sections of the sense transistor includes a second one of the sense transistor gates;
the first sense transistor gate is connected to the first gate electrode; and
the second sense transistor gate is connected to the second gate electrode.

16. The electronic circuit of claim 15, wherein:
the main transistor gates of the first group are interleaved with the main transistor gates of the second group; and
the sense transistor gates are interposed between two of the main transistor gates.

17. The electronic circuit of claim 16, wherein each of the main transistor gates forms part of a cell of the main transistor and each of the sense transistor gates forms part of a cell of the sense transistor, the electronic circuit further comprising:
a first source electrode disposed above the semiconductor body and connected to a source of the main transistor cells of the first group;
a second source electrode disposed above the semiconductor body and connected to a source of the main transistor cells of the second group; and
a third source electrode disposed above the semiconductor body and connected to a source of the sense transistor cells.

18. The electronic circuit of claim 15, wherein:
the main transistor gates of the first group are disposed in a first part of the semiconductor body;
the main transistor gates of the second group are disposed in a second part of e semiconductor body laterally spaced apart from the first part;
the first sense transistor gate is disposed in the first part of the semiconductor body; and
the second sense transistor gate is disposed in the second part of the semiconductor body.

19. The electronic circuit of claim 18, wherein:
the first sense transistor gate is interposed between two of the main transistor gates of the first group in the first part of the semiconductor body; and
the second sense transistor gate is interposed between two of the main transistor gates of the second group in the second part of the semiconductor body.

20. The electronic circuit of claim 18, wherein:
each of the main transistor gates forms part of a cell of the main transistor;
the first sense transistor gate forms part of a first cell of the sense transistor;
the second sense transistor gate forms part of a second cell of the sense transistor;
a combined active area of the main transistor cells included in the first part of the semiconductor body is different than the combined active area of the main transistor cells included in the second part of the semiconductor body; and
an active area of the first sense transistor cell is scaled in relation to the active area of the second sense transistor cell based on the difference between the combined active areas of the main transistor cells included in the first and second parts of the semiconductor body.

21. The electronic circuit of claim 13, wherein each individually controllable section of the main transistor comprises a plurality of gates disposed in trenches formed in the semiconductor body and connected to the same one of the gate electrodes, and wherein each individually controllable section of the sense transistor comprises a gate disposed in a trench formed in the semiconductor body and connected to the same gate electrode as the individually controllable section of the main transistor mirrored by that individually controllable section of the sense transistor.

22. The electronic circuit of claim 21, wherein the gates of the sense transistor are disposed closer to a center region of the main transistor than to an edge region of the main transistor.

* * * * *